(12) United States Patent
Sugimoto et al.

(10) Patent No.: US 10,560,991 B2
(45) Date of Patent: Feb. 11, 2020

(54) LIGHT EMITTING DEVICE

(71) Applicant: Yazaki Corporation, Tokyo (JP)

(72) Inventors: Terumitsu Sugimoto, Makinohara (JP);
Koji Ikegaya, Makinohara (JP)

(73) Assignee: YAZAKI CORPORATION,
Minato-ku, Tokyo (JP)

( * ) Notice: Subject to any disclaimer, the term of this patent is extended or adjusted under 35 U.S.C. 154(b) by 52 days.

(21) Appl. No.: 15/831,747

(22) Filed: Dec. 5, 2017

(65) Prior Publication Data

US 2018/0206302 A1   Jul. 19, 2018

(30) Foreign Application Priority Data

Jan. 16, 2017   (JP) .................. 2017-004787

(51) Int. Cl.
| | |
|---|---|
| *F21V 33/00* | (2006.01) |
| *H05B 33/08* | (2006.01) |
| *G09G 3/14* | (2006.01) |
| *H01L 25/075* | (2006.01) |
| *F21Y 113/13* | (2016.01) |
| *F21Y 115/10* | (2016.01) |
| *G09G 3/34* | (2006.01) |

(52) U.S. Cl.
CPC .......... *H05B 33/0827* (2013.01); *G09G 3/14* (2013.01); *H01L 25/0753* (2013.01); *H05B 33/0812* (2013.01); *H05B 33/0815* (2013.01); *H05B 33/0848* (2013.01); *F21Y 2113/13* (2016.08); *F21Y 2115/10* (2016.08); *G09G 3/3413* (2013.01); *G09G 2320/0666* (2013.01)

(58) Field of Classification Search
CPC ............................ F21V 23/04; F21V 23/0414

USPC ........................................................ 362/155
See application file for complete search history.

(56) References Cited

U.S. PATENT DOCUMENTS

| | | | | |
|---|---|---|---|---|
| 8,362,703 B2* | 1/2013 | Kumar | ............... | H05B 33/0824 257/79 |
| 8,704,433 B2* | 4/2014 | Jung | .................. | H01S 5/02469 313/46 |
| 8,866,416 B2* | 10/2014 | Burrows | .................. | F21K 9/00 315/312 |

(Continued)

FOREIGN PATENT DOCUMENTS

| JP | 2013-157493 A | 8/2013 |
|---|---|---|
| JP | 2016-135648 A | 7/2016 |
| JP | 2016-202148 A | 12/2016 |

OTHER PUBLICATIONS

Communication dated Feb. 5, 2019, from Japanese Patent Office in counterpart application No. 2017-004787.

*Primary Examiner* — Daniel St Cyr
(74) *Attorney, Agent, or Firm* — Sughrue Mion, PLLC

(57) ABSTRACT

A light emitting device capable of reducing the number of parts while suppressing temperature rise of a light source board. Each of a plurality of LED units has an LED boards, and constant current boards. LED board is equipped with a blue LED, a red LED, and a green LED, LED board is equipped with a blue LED, a red LED, and a green LED. A constant board is equipped with a constant current circuit supplying constant current to the red LEDs and having the largest driving current. The constant current board is equipped with constant current circuits supplying constant current to the remaining blue LEDs, and the green LEDs.

2 Claims, 3 Drawing Sheets

(56) References Cited

U.S. PATENT DOCUMENTS 8,894,268 B2 * 11/2014 Igaki .................... F21V 29/004
362/249.02
8,915,610 B2 * 12/2014 Fujita ...................... F21S 8/02
362/227

* cited by examiner

LIGHT EMITTING DEVICE

TECHNICAL FIELD

The present invention relates to a light emitting device.

BACKGROUND ART

In order to stably light up while maintaining the brightness of the LED (light source) constant, it is necessary to drive the LED with constant current. For this purpose, a constant current source is used. LED drive circuit in Japanese Patent Application Publication No. 2013-157493 is provided with three constant current circuits for three LEDs connected in parallel to each other.

Further, for example, an LED board arranged at the front of the vehicle, an LED board arranged at the rear of the vehicle, and a constant current board are connected in series, and a plurality of LED boards is supplied with a drive current by one constant current board.

However, in the above-described LED drive circuit, the LED boards arranged in front and rear respectively, and the constant current circuit are set in separate housings, and are provided as separate parts. Therefore, there has been a problem that the number of parts increases. In recent years, in vehicles, the number of parts of the LED mounted tends to increase, further leading to increase of the number of parts.

Therefore, it is conceivable that the constant current board and one of the plurality of LED boards are mounted in the same housing to form one part. However, the LED has low heat resistant though the constant current circuit generates a large amount of heat, making it difficult to make them as one part as described above.

PATENT DOCUMENT

Patent Document 1: Japanese Unexamined Patent Application Publication No. 2013-157493

DISCLOSURE OF THE INVENTION

Problem to be Resolved by the Invention

The present invention has been made in view of the above background, and aims at providing a light source board capable of restraining temperature rise of the light source board while reducing the number of parts.

Means for Solving the Problems

A light emitting device according to a first aspect of the present invention includes: a plurality of light source units including a light source board on which a plurality of types of light source to be connected to each other in parallel is mounted, a constant current board on which a constant current circuit for supplying current to the light source is mounted, and a housing for housing the light source board and the constant current board, the light sources of the same type of the plurality of the light source units are connected in series to each other, and a plurality of constant current circuits is connected in series every type of the light source, and is disposed dispersedly on the constant current board of the plurality of light source units.

In the light emitting device according to a second aspect, a plurality of light sources emitting lights of different colors from each other is mounted in parallel to each other on the light source board, the type is distinguished by emission color, and the light sources of the plurality of light source units emitting the same color are connected in series with each other.

In the light emitting device according to a third aspect, two light source units are provided, the light source board is provided with the light sources of three types, the constant current circuits for each supplying current to the light sources of two types are mounted on one constant current board of the two light source units, each drive current for the light sources of the two types is smaller among the light sources of three types, and the constant current circuit for supplying current to the light source of one type is mounted on the other constant current board of the two light source units, the drive current of the light source of the one type is the largest among the light sources of the three types.

The light emitting device of a fourth aspect, further includes a control unit for independently controlling the light sources of three types, one of the two light source units is provided with a first power supply terminal for supplying power to the light source board and the constant current board, a second power supply terminal for supplying power to the other of the two light source units, three first connection terminals for each connecting the light sources of three types to the other of the two light source units, and a second connection terminal for connecting the light source, the drive current of which is the largest among the three light source types, to the control unit, and the other of the two light source units is provided with a third power supply terminal to be connected to the second power supply terminal, three third connection terminals for each connecting the light sources of three types, to the one of the two light source units, and two fourth connection terminals for connecting the light sources of two types, the drive current of which is smaller among the three light source types, to the control unit.

Advantageous of the Invention

As described above, according to the first aspect, the plurality of constant current circuits connected in series to the light source is arranged dispersedly on the constant current boards of the plurality of light source units. As a result, it is possible to reduce the number of parts while suppressing the rise on the temperature of the light source board.

According to the second aspect, the color of the light source mounted on the light emitting board can be controlled.

According to the third aspect, the constant current circuit having the largest drive current and the remaining two constant current circuits of the three constant current circuits are arranged dispersedly, making it possible that the suppression of the temperature rise on the light source boards of the two light source units can be brought close to the same degree. Therefore, the temperature rise of the light source board can be further suppressed.

According to the fourth aspect, since the number of terminals of the two light source units can be made equal, it is possible to share a connector for accommodating a terminal, a housing, and the like.

DETAILED DESCRIPTION OF THE INVENTION

First Embodiment

Figure 1:
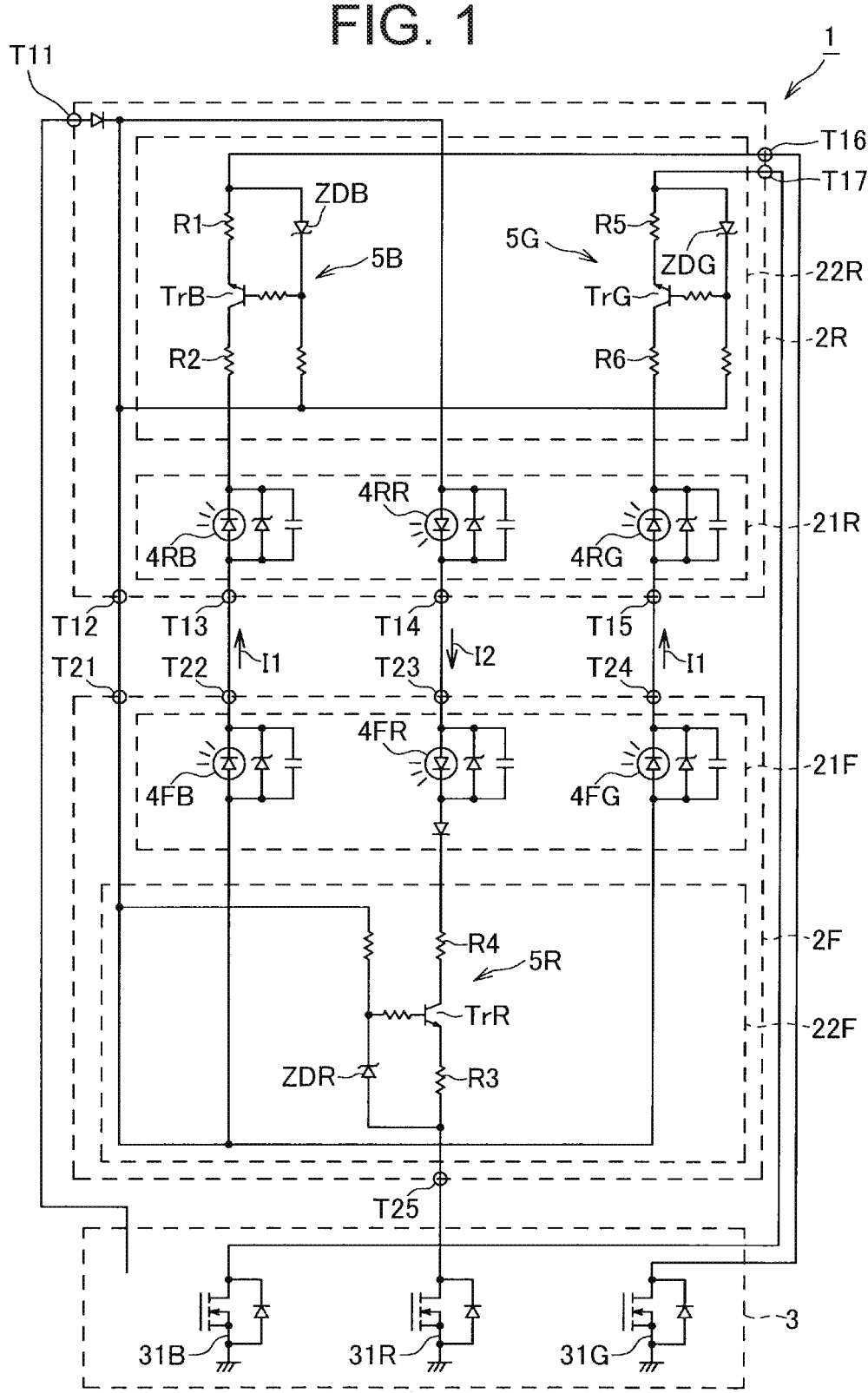
FIG. 1 is a circuit diagram showing an LED device as a light emitting device of the present invention in a first embodiment.
Figure 2:
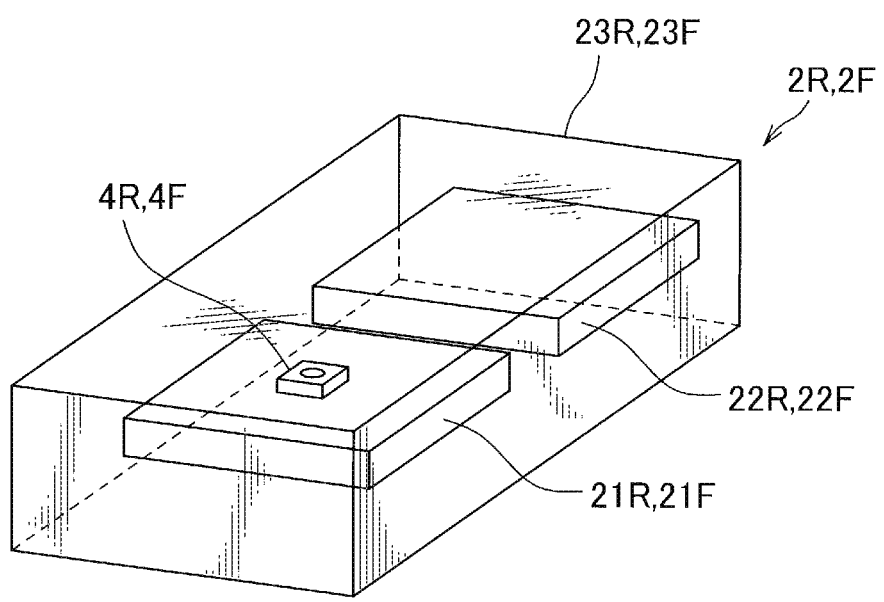
FIG. 2 is a schematic perspective view showing an example of the LED unit shown in FIG. 1.

Hereinafter, a first embodiment of the present invention will be described with reference to FIGS. 1 and 2. FIG. 1 is a circuit diagram showing an LED device as a light emitting device in the first embodiment of the present invention. FIG. 2 is a schematic perspective view showing an example of an LED unit shown in FIG. 1.

The LED device 1 according to the present embodiment, which is mounted on a vehicle, for example, is a device for illuminating a passenger compartment or a cabin exterior. Of course, the LED device 1 may be mounted on a device other than the vehicle.

The LED device 1 includes two LED units 2R, 2F, and a relay connector 3 serving as a control unit for controlling two LED units 2R, 2F. The LED unit 2R is arranged on the rear side of the vehicle, and the LED unit 2F is arranged on the front side of the vehicle.

The LED units 2R and 2F respectively have LED boards (light source boards) 21R and 21F, current boards 22R, 22F, and housings 23R and 23F (see FIG. 2) for accommodating these LED boards 21R and 21F, and the current boards 22R, 22F. The LED boards 21R, 21F are equipped with full-color LEDs 4R, 4F, respectively.

The full color LED 4R is constituted by three LEDs (light sources) which are distinguished by the emission color of the LEDs of a red LED 4RR, a green LED 4RG, a blue LED 4RB. The blue LED 4RB, the red LED 4RR, the green LED 4RG are connected in parallel. Full color LED 4F are constituted by three kinds of LEDs (light source) of a blue LED 4FB, a red LED 4FR, and a green LED 4FG. These blue LED 4FB, red LED 4FR, green LED 4FG are connected in parallel.

The LEDs of the same color out of the two LED units 2R and 2F are connected in series with each other. That is, the blue LED 4RB and the blue LED 4 FB are connected in series. The red LED 4RR and the red LED 4FR are connected in series. The green LED 4RG and the green LED 4FG are connected in series. In the present embodiment, the blue LED 4RB, the green LED 4RG are connected to the power supply downstream side of the blue LED 4FB and the green LED 4FG, respectively. Also, the red LED 4RR is connected to the power supply upstream side of the red LED 4FR.

Further, the LED device 1 is provided with a blue constant current circuit 5B, a red constant current circuit 5R, a green constant current circuit 5G. The blue constant current circuit 5B is connected directly to the blue LEDs 4RB, 4FB, and the constant current I1 is supplied to the blue LEDs 4RB and 4FB. The red constant current circuit 5R is connected in series to the red LEDs 4RR, 4FR, and the constant current I2 is supplied to the red LEDs 4RR, 4FR. The green constant current circuit 5G is connected in series to the green LEDs 4RG and 4 FG, and the constant current I1 is supplied to the green LEDs 4RG, 4FG.

The red LEDs 4RR, 4FR need be supplied with a driving current larger than that of the driving current of the blue LEDs 4RB, 4FB, and green LEDs 4RG, 4FG. Therefore, the current I2 supplied by the red constant current circuit 5 is larger than the constant current I1 supplied by the blue and green constant current circuits 5B and 5G. In the form of the implementation, the constant current I1 supplied by the blue constant current circuit 5B is equal to the constant current I1 supplied by the green constant current circuit 5G.

In the present embodiment, both the blue constant current circuit 5B and the green constant current circuit 5G are mounted on the constant current board 22R (one of the two LED units 2R and 2F). Further, the red constant current circuit 5R is mounted on the constant current board 22F of the LED unit 2F (the other of the two LED units 2R and 2F).

The housings 23R, 23F are made of, for example, resin and formed into a box shape. The LED board 21R and the constant current board 22R, as shown in FIG. 2, are housed in one housing 23R. The LED board 21R and the constant current board 22R are spaced apart from each other in the housing 23R. Between the LED board 21R and the constant current board 22R, a not-shown heat sink may be arranged so that the heat is less likely transmitted from the constant current board 22R to the LED board 21R. Likewise, the above-described LED board 21F and constant current board 22F are also provided in one housing 23F.

The relay connector 3 has three FETs 31B, 31R, 31G, a switch control section (not shown) for controlling on/off of these three FETs 31B, 31R, 31G. The three FETs 31B, 31R, and 31G are connected in series to the blue LED 4RB and 4FB, the red LED 4RR and 4FR, and the green LED 4RB and 4FB, respectively. The FETs 31B, 31R and 31G are respectively constituted by N channel power MOSFET.

FETs 31B and 31G have each drains connected to cathodes of the blue LED 4RB and the green LED 4RG through the blue constant current circuit 5B and green constant current circuit 5G, respectively, and have their sources connected to the ground. FETs 31R has its drain connected to a cathode of the red LED 4FR through the red constant current circuit 5R, and has its source connected to the ground.

Gates of the FETs 31B, 31R and 31G are connected to a switch control section (not shown), and ON/OFF of FET 31B, 31R, 31G are each controlled by the switch control section. In the embodiment, a switch control unit (not shown) supplies duty controlled pulse to the gates of the FETs 31B, 31R, 31G (PWM control). Adjustment of the duty of this pulse can adjust the luminance and luminescent color of the full-color LEDs 4R and 4F.

In addition, the LED unit 2R is provided with total seven terminals of a power supply terminal T11 for supplying power, a power supply terminal T12 for supplying power to the LED unit 2F, three connection terminals T13, T14, and T15 for connecting the blue LED 4RB, the red LED 4RR, and the green LED 4RG to the blue color LED 4FB, the red LED 4FR, and the green LED 4FG, and two connection terminals T16, T17 for connecting the green constant current circuit 5G to the relay connector 3. These terminals T11 to T17 are connected to a not-shown connector housing, constituting a connector. The power supply terminal T11 is connected to the power terminal of the relay connector 3.

In the LED unit 2F is provided with total five terminals of a power supply terminal T21 connected to the power supply terminal T12, three connection terminals T22, T23 and T24 for connecting the blue LED 4FB, the red LED 4FR, and the green LED 4FG to the blue LED 4RB, the red LED 4RR, and the green LED 4RG of the LED unit 2R, respectively, and a connection terminal T25 for connecting the red constant current circuit 5R to the relay connector 3. These terminals T21 to T25 are accommodated in a not-shown connector housing, and constitute a connector.

Next, details of the above-described constant current circuits 5B, 5R, and 5G will be described. Above-mentioned constant current circuits 5B, 5R, and 5G are respectively constituted by transistors TrB, TrR, and TrG, and zener diodes ZDB, ZDR, and ZDG provided between the base and the emitter of transistors TrB, TrR, TrG.

The transistors TrB and TrG of the constant current circuits 5B and 5G have their emitters connected to the connection terminals T16, T17 via the resistors R1, R5, and the collector connected to their cathodes of the LED 4RB, and green LED 4RG via the resisters R2, R6, and the bases are connected to the power supply terminal T11 via the power terminal T11. The constant current circuits 5B and 5G are connected in series on the downstream side further than the blue LEDs 4RB and 4RG.

The transistor TrR of the constant current circuit 5R has its emitter connected to the connection terminal T25, its collector connected to the cathode of the red LED 4FR via the resistor R4, and its base connected to the power supply terminal T21 via a resistor. The constant current circuit 5R is connected in series on the power supply downstream side further than the red LED 4FR.

Next, the operation of the LED device 1 having the above-described configuration will be described. When FET 31B, FET 31G are turned on, the blue light LEDs 4RB and 4FB, the blue LEDs 4RB and 4FB have the constant current I1 flow therethrough by the function of the constant current circuits 5B, 5G, causing the blue LEDs 4RB and 4FB, and the green LEDs 4RG and 4FG to emit. Further, when the FET 31R is turned on, the red LEDs 4RR and 4FR have the constant current I2 flow therethrough by the function of the constant current circuit 5R, causing the red LEDs 4RR and 4FR to emit. Note that the constant current I2 is a current larger than the constant current I1.

Next, the heat generation value of the LED device 1 having the above-described configuration will be described. The LED board 21R of the LED unit 2R, and the LED board 21F of the LED unit 2F have the same patterned currents I1 and I2 flow through equivalent LEDs 4RB and 4FB, 4RR and 4FR, 4RG and 4FG, so that the heat generation values are substantially equal.

The constant current board 22R of the LED unit 2R is provided with two constant current circuits 5B and 5G mounted thereon, however, the constant current I1 generated by the constant current circuits 5B and 5G is smaller than the constant current I2 generated by the constant current circuit 5R. On the other hand, the constant current board 22F of the LED unit 2F has only one constant current circuit 5R mounted thereon, but the constant current I2 generated by the constant current circuit 5R is larger than the constant current I1 generated by the constant current circuit 5G. Therefore, the constant current circuits 5B, 5G, and 5R can be dispersedly arranged on the two constant current boards 22R and 22F so that the heat generation values generated on the two constant current boards 22R and 22F come close to each other.

That is, according to the above-described first embodiment, the constant current circuits 5B, 5R, and 5G are dispersedly arranged on the constant current boards 22R and 22F of two LED units 2R, 2L. In this way, even if the constant current circuits 5B, 5G, 5R are incorporated in the LED units 2R, 2F, the LED board 21R and 21F, it is possible to reduce the number of parts while suppressing the temperature rise of the LED board 21R and 21F.

According to the above-described first embodiment, the LED boards 21R and 21F are provided with the plurality of light-emitting LEDs 4RB and 4FB, 4RR and 4FR, 4RG and 4FG emitting different colors from each other, with their being connected to each other in parallel, and the LEDs 4RB and 4FB, 4RR and 4FR, and 4RG and 4FG of the same color of the plurality of LED units 2R and 2F are connected in series to each other, respectively. Thus, the colors of the full-color LEDs 4R and 4F mounted on the LED boards 21R and 21F can be controlled.

According to the above-described first embodiment, the three constant current circuits 5B, 5R, and 5G are dispersedly arranged with a large constant current circuit 5R, and the remaining two constant current circuits 5B and 5G. Thereby, the temperature of the LED boards 21R and 21F of the two LED units 2R and 2F can be suppressed to the same level. Therefore, the temperature rise of the LED boards 21R and 21F can be suppressed.

According to the above-described first embodiment, each of the LED boards 21R and 21F is provided with three LEDs 4RB, 4RR, 4RG and LEDs 4FB, 4FR, 4FG mounted thereon, but is not limited to this. As the LED boards 21R and 21F, a plurality of LEDs may be mounted, two LEDs may be mounted, or three or more LEDs may be mounted. Further, the LEDs mounted on the LED boards 21R and 21F emit different colors, but is not limited to this. A plurality of LEDs of the same color may be mounted.

Further, according to the above-described first embodiment, the number of the LED units 2R and 2F is two, but is not limited to this. Three or more LED units may be provided.

Further, according to the above-described first embodiment, the three constant current circuits 5B, 5R, and 5G are arranged in such a manner that the constant current circuit 5R of which driving current is the largest, and the remaining two constant current circuits 5B, 5G are dispersed, but are not limited to this. In the present invention the plurality of constant current circuits 5B, 5R, 5G may not built in only one of the plurality of LED units 2R and 2F, but may be distributed in the respective 2R and 2F. Therefore, the constant current circuit 5B and the constant current circuits 5R and 5G may respectively be dispersed. This case can even more suppress the temperature rise of the LED boards 21R and 21F than the case where they are built in only one of the LED boards 21R and 21F.

Further, according to the above-described first embodiment, the constant current circuits 5B, 5R, and 5G are constituted by transistors TrB, TrR, TrG and zener diodes ZDB, ZDR, ZDG, but are not limited to this. As the constant current circuits 5B, 5R, 5G, other well-known constant current circuits that can supply a constant current may be used.

Second Embodiment

Figure 3:
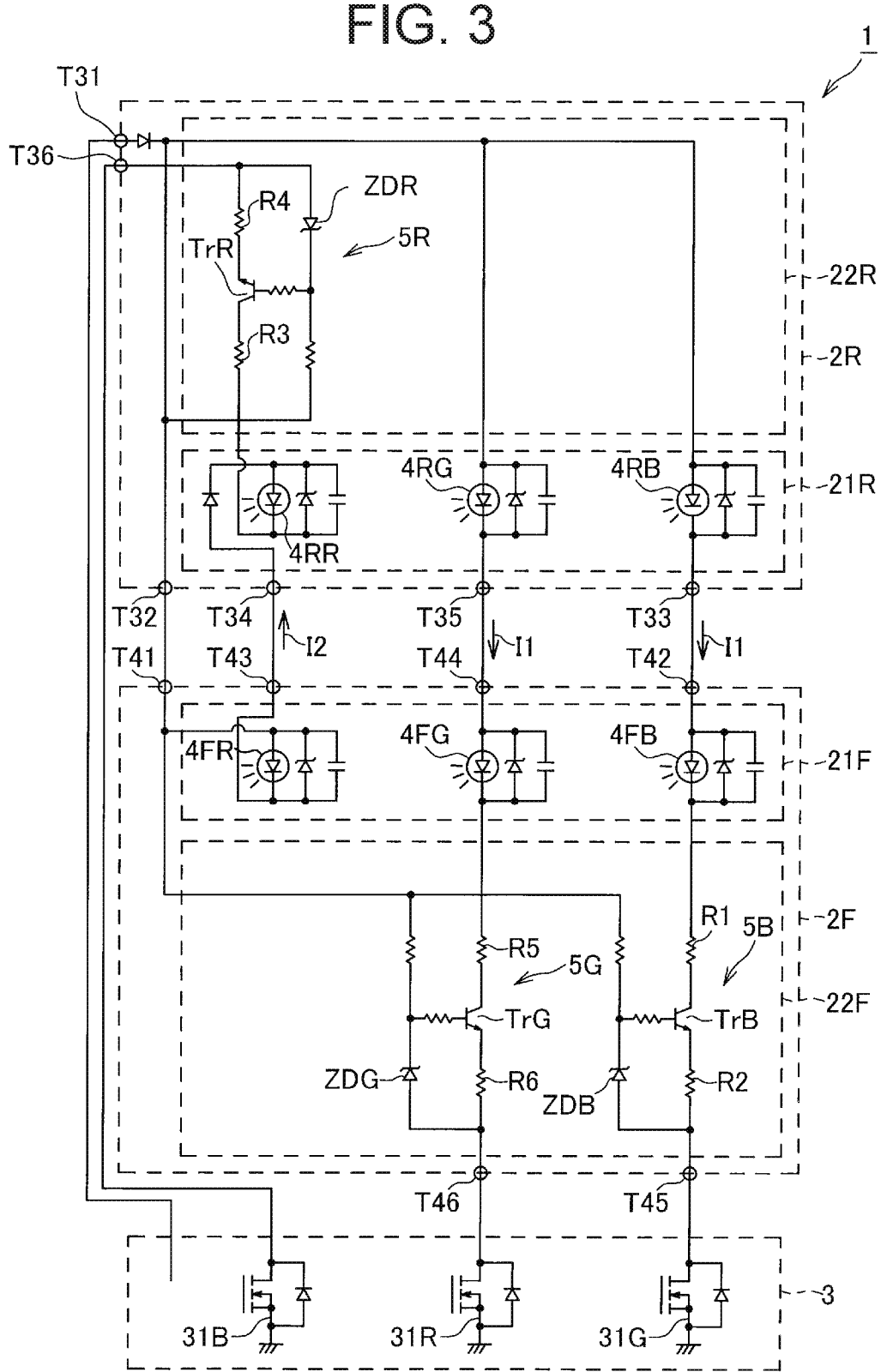
FIG. 3 is a circuit diagram showing an LED device as a light emitting device of the present invention in a second embodiment.

Next, a second embodiment of the present invention will be described with reference to FIG. 3. FIG. 3 is a circuit diagram showing an LED device as a light emitting device of the present invention in the second embodiment. In the figure, the parts equivalent to those of the LED apparatus of FIG. 1 already described in the first embodiment are denoted with the same reference numerals, and its detailed explanation will be omitted.

In the above-described first embodiment, the number of terminals of the LED unit 2R is seven, and the number of terminals of the LED unit 2R is five. Therefore, it is necessary to use a 7-pin connector, and 5 pins as a connector, common connector cannot be used for the two LED units 2R and 2F. In addition it is impossible to share the housings 23R and 23F. Thus, in the second embodiment, the number of terminals of the LED unit 2R and the number of terminals of the LED unit 2F are made equal, so that the connectors and the housings 23R, 23F can be made common.

In the second embodiment, the blue LED 4RB and the green LED 4RG are connected to the power supply upstream side of the blue LED 4FB, and the green LED 4F, respectively. On the other hand, the red LED 4RR is arranged on the power supply downstream side of the red LED 4FR.

By doing like this, in the first embodiment, the constant current I1 is supplied from the LED unit 2F to the LED unit 2R, and the constant current I2 flows from the LED unit 2R to the LED unit 2R, whereas in the second embodiment the constant current I1 flows from the LED unit 2R toward the LED unit 2F, and the constant current I2 flows from the LED unit 2F to the LED unit 2R.

Further, the LED unit 2R is provided with total six terminals of a power supply terminal T31 (first power supply terminal) for supplying power, a power supply terminal T32 (second power supply terminal) for supplying power to the LED unit 2F, three connection terminals T3, T4, and T5 (first connection terminal) for connecting the blue LED 4RB, the red LED 4RR, and the green LED 4RG of the LED unit 2F to the blue LED 4FB, the red LED 4FR, and the green LED 4FG of the LED unit 2F, a connection terminal T36 (second connection terminal) for connecting the red LED 4RR.

On the other hand, the LED unit 2F is provided with six terminals of a power terminal T41 (third power source terminal) connected with the power source terminal T32, three connection terminals T42, T43, T44 (third connection terminal) for connecting the blue LED 4FB, the red LED 4FR, and the green LED 4FG, and two connection terminals T45 and T46 (fourth connection terminal) for connecting the blue LED 4RB, the red LED 4 RR, and the green LED 4RG to the relay connector 3.

In the second embodiment, the constant current circuits 5B and 5G are mounted on the constant current board 22F. As a result, the constant current circuits 5B and 5G are disposed downstream of the blue LED 4FB and the green LED 4RG. Further, the constant current circuit 5R is mounted on the constant current board 22R. Thus, the constant current circuit 5R is connected to the downstream side of the red LED 4RR.

Specifically, the transistors TrB and TrG of the constant current circuits 5B and 5G have their collectors connected to the cathodes of blue LED 4FB and green LED 4FG via resistors R1, R5, their emitters connected to the connection terminals T45 and T46 via the resistors R2 and R6, their bases connected to the power supply terminal T41 via each resistor.

Further, the transistor TrR of the constant current circuit 5R has its collector connected to the red LED 4RR via the resistor R3, and its emitter connected to the connection terminal T36 via the resistor R4, and its base connected to the power supply terminal T31 via a resistor.

According to the above-described second embodiment, the number of terminals of the two LED units 2R and 2F becomes the same, and therefore, it is possible to share connectors, housings 23R, 23F, etc.

It should be noted that the present invention is not limited to the above embodiment. That is, various modifications can be made without deviating from the gist of the present invention.

EXPLANATION OF SIGN

1 LED device (light emitting device)
2R LED unit (light source unit)
2F LED unit (light source unit)
3 relay connector (control unit)
4RB blue LED (light source)
4RR red LED (light source)
4RG green LED (light source)
4FB blue LED (light source)
4FR red LED (light source)
4FG green LED (light source)
5B blue constant current circuit (constant current circuit)
5R red constant current circuit (constant current circuit)
5G green constant current circuit (constant current circuit)
21R LED board (light source board)
21F LED board (light source board)
22R constant current board
22F constant current board
23R housing
23F housing
T31 power supply terminal (first power supply terminal)
T32 power supply terminal (second power supply terminal)
T33 to T35 connection terminal (first connection terminal)
T36 connection terminal (second connection terminal)
T41 power supply terminal (third power supply terminal)
T42 to T44 connection terminal (third connection terminal)
T45, T46 connection terminal (fourth connection terminal)

The invention claimed is:

1. A light emitting device comprising:
   a plurality of light source units including:
      a light source board on which a plurality of types of light sources to be connected to each other in parallel is mounted;
      a constant current board on which a constant current circuit for supplying current to the light source is mounted; and
      a housing for housing the light source board and the constant current board,
   wherein the light sources of the same type of the plurality of the light source units are connected in series to each other,
   wherein colors of lights emitted by the light sources are different for each of the types,
   wherein a plurality of constant current circuits are connected in series with each type of the light sources, and are disposed dispersedly on the constant current boards of the plurality of light source units,
   wherein two light source units are provided,
   wherein the light source board is provided with the light sources of three types,
   wherein the constant current circuits for each supplying current to the light sources of two types are mounted on one constant current board of the two light source units, each drive current for the light sources of the two types is smaller among the light sources of three types, and
   wherein the constant current circuit for supplying current to the light source of one type is mounted on the other constant current board of the two light source units, the drive current of the light source of the one type is the largest among the light sources of the three types.

2. The light emitting device according to claim 1, further comprising:
   a control unit for independently controlling the light sources of three types, wherein
   one of the two light source units is provided with a first power supply terminal for supplying power to the light source board and the constant current board, a second power supply terminal for supplying power to the other of the two light source units, three first connection terminals for each connecting the light sources of three types to the other of the two light source units, and a second connection terminal for connecting the light source of one type, the drive current of which is the largest among the light source of three types, to the control switch, and wherein
the other of the two light source units is provided with a third power supply terminal to be connected to the second power supply terminal, three third connection terminals for each connecting the light sources of three types to the one of the two light source units, and two fourth connection terminals for connecting the light sources of two types, the drive currents of which are smaller among the three light source types, to the control unit.

* * * * *